United States Patent [19]

Jacquez

[11] Patent Number: 4,689,276

[45] Date of Patent: Aug. 25, 1987

[54] DIAMOND BONDED ELECTRONIC CIRCUIT

[75] Inventor: Andrew E. Jacquez, Saratoga, Calif.

[73] Assignee: Varian Associates, Palo Alto, Calif.

[21] Appl. No.: 695,426

[22] Filed: Jan. 28, 1985

Related U.S. Application Data

[63] Continuation of Ser. No. 466,754, Mar. 15, 1983, abandoned.

[51] Int. Cl.$^4$ ............................................. B27C 31/00
[52] U.S. Cl. ................................... 428/594; 228/193;
428/621; 428/659; 428/666; 428/667; 428/677
[58] Field of Search ........................... 419/11; 428/621

[56] References Cited

U.S. PATENT DOCUMENTS

| | | | |
|---|---|---|---|
| 3,894,673 | 7/1975 | Lowder et al. | 228/220 X |
| 3,902,873 | 9/1975 | Hughes | 51/295 X |
| 3,924,031 | 12/1975 | Nicholas et al. | 51/295 X |
| 3,929,432 | 12/1975 | Caveney | 51/295 |
| 3,999,962 | 12/1976 | Drui et al. | 51/307 |

Primary Examiner—Deborah L. Kyle
Assistant Examiner—T. J. Wallen
Attorney, Agent, or Firm—Stanley Z. Cole; Gerald M. Fisher; Peter J. Sgarbossa

[57] ABSTRACT

Diamonds are good thermal conductors and also good insulators. They are thus exceptionally useful as heat-removing supports for small microwave circuit elements which must be electrically insulated from their ultimate heat sink. Bonding diamonds to metallic parts has been done using active metals such as titanium and zirconium in conjunction with or as ingredients in solder alloys, which then are able to wet the diamond surface and bond to it.

The invention comprises a method of diffusion bonding to diamonds without a molten solder. This solves the problem of contaminating the open diamond surfaces with braze materials which produce electrical leakage. Also the bonded area is precisely limited so that the electrical properties of the circuit are not disturbed.

A tiny slow-wave circuit for a traveling-wave tube has been supported by a linear array of diamonds bonded to it and to the surrounding heat-sink barrel of the tube.

9 Claims, 5 Drawing Figures

DIAMOND BONDED ELECTRONIC CIRCUIT

This application is a continuation of application Ser. No. 466,754, filed Feb. 15, 1983, now abandoned.

FIELD OF THE INVENTION

The invention pertains to supports for electronic parts which must be electrically insulated from the sinks which carry off the heat generated in them. Semiconductor devices and slow-wave circuits for high-frequency traveling-wave tubes (TWT's) have encountered this problem. It is known that diamonds offer a unique combination of high thermal conductivity and excellent dielectric properties.

PRIOR ART

The problem of bonding diamonds to metals has been investigated for a considerable time. The original impetus was for abrading tools in which diamond crystals were held in or on the surface of a metal support member. Two basic methods were discovered. One was to apply a layer of active metal to the diamond which was then brazed to the metal support with a conventional noble-metal solder. The other was to use a solder alloy of a noble metal and an active metal.

U.S. Pat. No. 3,178,273 issued Apr. 13, 1965, to Herbert Libal describes covering the diamonds on the support with powdered zirconium or titanium, then melting silver, copper, silver-copper alloy or silver-indium alloy to produce the bond.

U.S. Pat. No. 3,894,673 describes nickel-cobalt-chromium alloy solder.

U.S. Pats. No. 3,868,750 and 3,856,480 describe gold-tantalum or gold-niobium alloys.

U.S. Pat. No. 3,713,790 describes alloys of chromium with copper, gold or silver.

U.S. Pat. No. 3,678,568 describes aluminum-silicon alloys.

In all the known prior art, the bond to the diamond was formed by wetting with a molten solder. In Applicants' work with tiny electronic devices where diamonds are used as heat-conducting insulating supports they have found that molten solders creep over the diamond surfaces, degrading the uniformity and reproducibility of the circuit. Also, they contaminate the surface causing electrical leakage.

SUMMARY OF THE INVENTION

A purpose of the invention is to provide bonds between diamonds and metallic parts which are mechanically accurate and easy to manufacture.

A further purpose is to provide a bond which s a good conductor of heat.

A further purpose is to provide a bond which leaves the free diamond surfaces clean and accurately defined.

These purposes are fulfilled by holding the diamond in pressure contact with a bonding element made of an alloy of an active metal and an inactive metal. The assembly is heated below the melting point so that the active material diffuses to the diamond surface and forms a diffusion bond thereto.

DESCRIPTION OF THE PREFERRED EMBODIMENTS

Figure 1:
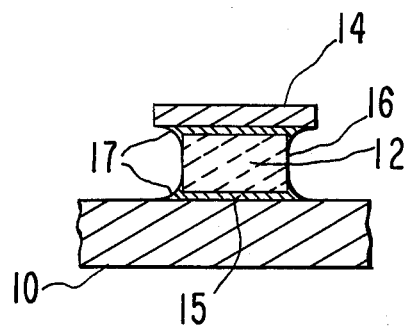
FIG. 1 is a schematic cross section of a prior-art diamond mounting assembly.

FIG. 1 illustrates a prior-art assembly of a diamond support member 12 brazed between a metallic heat sink 10 and a metallic heat source 14 such as a transistor. The diamond 12 provides thermal conductivity and an insulating support. The bonds are made by melting a brazing alloy 15, typically an alloy of an active metal such as titanium and inactive metals such as copper and silver. The molten alloy wets the diamond and creeps onto the exposed surfaces 16 by capillary attraction, forming fillets 17. When the supported member is part of a critical microwave circuit, the fillets can alter its electrical properties. In particular, when the supported object 14 is an element of a periodic circuit such as used in millimeter wave traveling-wave tubes, the presence of non-reproducible fillets can distort the periodicity, thus degrading the tube performance. Also, we have found that molten braze alloys can produce electrical leakage across the free surfaces 16 of diamond 12.

Figure 2:
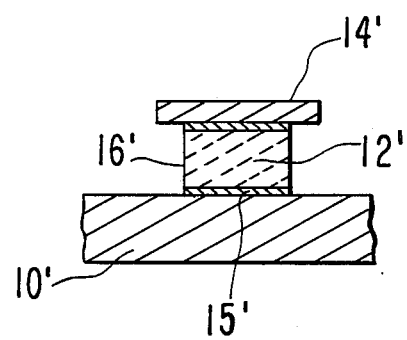
FIG. 2 is a schematic cross section of a diamond mounting assembly embodying the invention.

FIG. 2 illustrates a diamond support assembly made according to the invention. The elements correspond exactly to those of the prior-art FIG. 1 except that the bonding elements 15' are layers, strips, or patches of alloy which are bonded in their solid state by heating the assembly under pressure to a temperature below their melting point.

Suitable alloys for diffusion bonding to diamonds typically contain at least one active metal such as zirconium, titanium, tantalum, niobium or chromium which has the ability to react with an adhere to the diamond, perhaps by forming a metallic carbide interface. The active metal or metals is alloyed with one or more inactive metals to provide a structural body with strength and ductility. Suitable inactive metals are copper, gold, silver, iron, nickel or cobalt. We have produced particularly good bonds with a commercial alloy sold under the trade name of "Amzirc." This is an alloy of copper with approximately 0.15% zirconium. The brazing bond between the Amzirc and the diamonds is achieved by firing the assembly in an inert (helium) atmosphere at 800° to 900° C. It is possible to make the diffusion bond in vacuum, but we have found that a very good vacuum such as $10^{-6}$ torr is required, which is difficult to provide at the high temperature. An inert gas such as helium, argon, or neon is more practical. Any element or mixture of elements of the zero column of the periodic table is suitable. Helium is the cheapest of these. At temperature, the braze area is under at least 300 pounds per square inch pressure, provided by a jig (see FIG. 3) for applying compression as by differential thermal expansion.

During the heating, the zirconium diffuses to the contact surfaces and forms an active bond between the zirconium and the diamond to form a strong interface of zirconium carbide. Auger spectroscopy analysis of the braze structure shows large traces of zirconium and carbon at the interface area which was under pressure. No graphite or other form of carbon except diamond was found on the other surfaces of the diamonds.

Figure 3B:
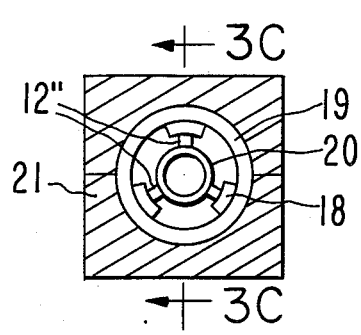
FIG. 3B is an end view of the second step of the assembly of FIG. 3A.
Figure 3A:
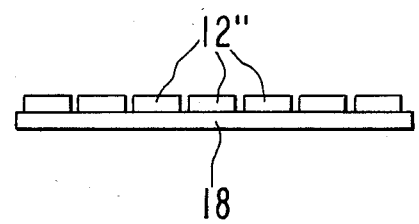
FIG. 3A is a side view of the first step of an assembly embodying the invention for a slow-wave circuit.

FIGS. 3 illustrate steps in producing a slow-wave structure for a millimeter-wave TWT. In FIG. 3A, on a tape 18 of Amzirc a row of diamonds 12" is arranged in a line, spaced by the period of the slow-wave structure to be built. In a suitable pressure jig (not shown) the diamonds are bonded to the Amzirc tape as described above.

FIG. 3B illustrates the next step. Three tape units 18 with attached rows of diamonds 12" are arranged within an envelope tube 19, as of oxygen-free, high-conductivity copper. Diamonds 12" face inward and are in contact with the hollow slow-wave circuit 20 which is fabricated from Amzirc alloy. This alloy also has valuable properties of strength and electrical and thermal conductivities. Circuit 20 is shown as the well-known ring-bar structure, but it may be any other circuit such as a simple tape helix or a ladder circuit in which the rungs are supported by diamonds between their solidly attached ends. Envelope 19 is placed inside a compression jig 21, of a material having a low thermal expansion such as molybdenum. The entire assembly is heated in an inert atmosphere as described above to bond the diamonds to the Amzirc circuit.

The final step in the assembly process is a conventional braze of the Amzirc tapes 18 into the envelope 19 with a molten solder such as copper-silver eutectic. This braze is also done in an inert atmosphere such as helium. Envelope 19 forms the heat sink for circuit 20, from which heat is readily removed for final dispersion.

Figure 3C:
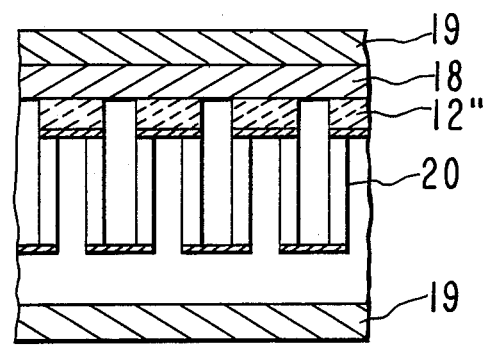
FIG. 3C is an axial section of the completed assembly for a slow-wave circuit.

FIG. 3C is an axial section showing the extended form of the finished structure. For clarity, only one diamond—Amzirc tape structure 18 is shown.

The above described examples are illustrative and not intended to be limiting. The process was invented in the development of TWTs with stringent structural and electrical requirements and is described largely in that context. There are, however, many other devices that may be benefitted by the invention, such as transistors, diodes or other solid-state devices which must be insulated from their heat sinks. Many other allows containing active metals known in the art to bond to diamonds may also be used.

The invention is to be limited only by the following claims and their legal equivalents.

We claim:

1. An extended electronic interaction circuit comprising a conductor means insulated and supported from an extended backing means by an extended array of diamond support members, at least the surfaces of said interaction circuit and said backing member abutting said diamonds being of an alloy of at least one active metal and at least one relatively inactive metal, said active metal being a member of the group consisting of zirconium, titanium, tantalum, niobium and chromium, said inactive metal being a member of the group consisting of copper, gold, silver, nickel, iron and cobalt, and said diamonds being bonded to said conductor means and said backing member by a diffusion bond.

2. The circuit of claim 1 wherein said group of active metals consists of zirconium and titanium.

3. The circuit of claim 1 wherein said group of inactive metals consists of copper, gold and silver.

4. The circuit of claim 1 wherein said active metal is zirconium and said inactive metal is copper.

5. The circuit of claim 1 wherein said backing member is joined to a metallic heat-sink in thermal conducting contact.

6. The circuit of claim 5 wherein said joint is a diffusion bond.

7. The circuit of claim 5 wherein said joint is by a solder having a melting temperature below that of said backing member.

8. The circuit of claim 1 wherein said conductor means is a slow-wave circuit of a helix-derived type.

9. A process of producing an extended electronic interaction circuit comprising a conductor means insulated and supported from an extended backing means by an extended array of diamond support members, at least the surfaces of said interaction circuit and said backing member abutting said diamonds being of an alloy of at least one active metal and at least one relatively inactive metal, said active metal being a member of the group consisting of zirconium, titanium, tantalum, niobium and chromium, said inactive metal being a member of the group consisting of copper, gold, silver, nickel, iron and cobalt, said process comprising the step of holding the diamonds under pressure against said surfaces of said conductor and said backing member in an inert atmosphere while heating to a temperature below the melting point of said alloy.

* * * * *

UNITED STATES PATENT AND TRADEMARK OFFICE
CERTIFICATE OF CORRECTION

PATENT NO. : 4,689,276

DATED : August 25, 1987

INVENTOR(S) : Andrew E. Jacquez

It is certified that error appears in the above-identified patent and that said Letters Patent are hereby corrected as shown below:

```
In the title:  "DIAMOND BONDED ELECTRONIC CIRCUIT"
should read:   --DIAMOND BONDED ELECTRONIC CIRCUIT
AND PROCESS FOR PRODUCING SAME--.

Col. 1, after first paragraph, insert:   --The Government
has rights in this invention pursuant to Contract No.
F 30602-79-C-0185 by the Department of the Air Force--.

Col. 4, line 30:  Change "of" to --for--.
```

Signed and Sealed this

Eleventh Day of October, 1988

Attest:

DONALD J. QUIGG

Attesting Officer

Commissioner of Patents and Trademarks